United States Patent [19]

Gay

[11] Patent Number: 5,428,562
[45] Date of Patent: Jun. 27, 1995

[54] FAST CONVERGING ADAPTIVE FILTER

[75] Inventor: Steven L. Gay, Long Valley, N.J.

[73] Assignee: AT&T Corp., Murray Hill, N.J.

[21] Appl. No.: 116,318

[22] Filed: Sep. 3, 1993

[51] Int. Cl.$^6$ .......... G06F 15/31; H04J 1/00; H04J 3/00

[52] U.S. Cl. .............. 364/724.19; 370/32.1; 379/406

[58] Field of Search ........... 364/724.19; 379/406, 379/410, 411, 345; 370/32.1

[56] References Cited

U.S. PATENT DOCUMENTS

| 5,001,701 | 3/1991 | Gay ............................... 370/32.1 |
| 5,177,734 | 1/1993 | Cummiskey et al. ............. 370/32.1 |

OTHER PUBLICATIONS

S. Makino and Y. Kaneda, "Exponentially Weighted Step-Size Projection Algorithm for Acoustic Echo Cancellers," *IEICE Trans. Fundamentals*, vol. E75-A, No. 11, 1500–1508 (Nov. 1992.).

M. Tanaka et al., "Reduction of Computation for High-Order Projection Algorithm," *1993 Electronics Information Communication Society* (and associated viewgraphs) (1993).

J. M. Cioffi et al., "Windowed Fast Transversal Filters Adaptive Algorithms with Normalization," *IEEE Transactions on Acoustics, Speech, and Signal Processing*, vol. ASSP-33, No. 3, 607–625 (Jun. 1985).

G. V. Moustakides et al., "Fast Newton Transversal Filters-A New Class of Adaptive Estimation Algorithms," *IEEE Transactions on Signal Processing*, vol. 39, No. 10, 2184–2192 (Oct. 1991).

*Primary Examiner*—Roy N. Envall, Jr.
*Assistant Examiner*—Emmanuel Moise
*Attorney, Agent, or Firm*—Thomas A. Restaino

[57] ABSTRACT

A fast affine projection adaptive filter capable of frequent parameter updating and fast convergence with low complexity. The invention mitigates affine projection adaptive filter complexity due to matrix inversion and the fact that a given excitation vector is weighted and summed into the adaptive coefficient vector many times. Embodiments of the invention achieve fast convergence through sample by sample updating and the exploitation of the shift invariant property of the excitation signal. Complexity is further reduced by a vector update procedure in which a given excitation vector is weighted and added into the coefficient estimate only once. Three illustrative embodiments are presented. The first of these is a relaxed adaptive filter, the second is an adaptive filter without relaxation and a third is an adaptive filter with suspended adaptation. The embodiments are presented in the context of electrical and acoustic echo cancellation.

7 Claims, 6 Drawing Sheets

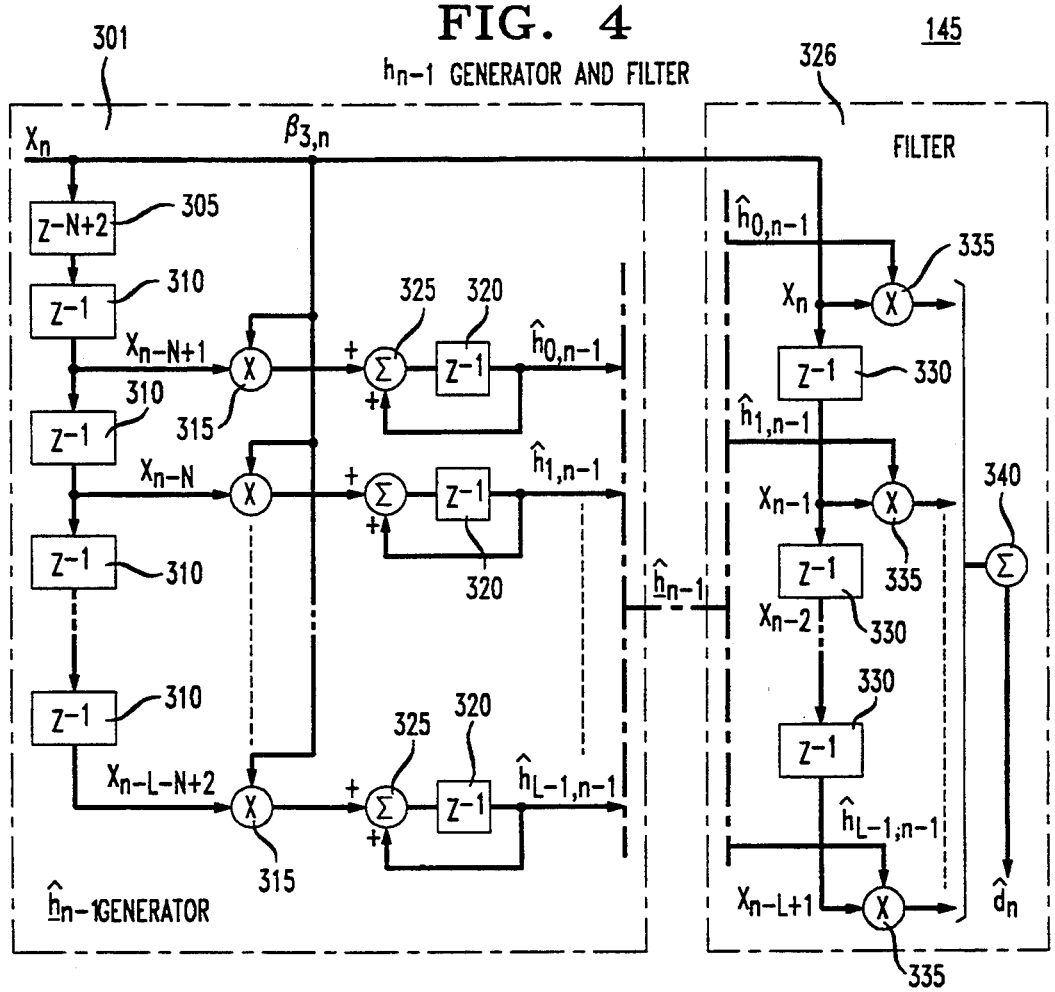
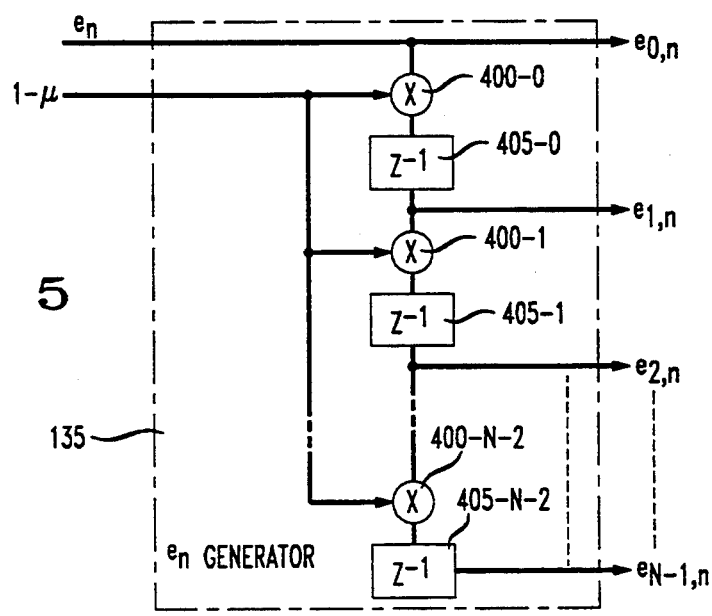

FAST CONVERGING ADAPTIVE FILTER

FIELD OF THE INVENTION

This invention relates to adaptive filters and, more particularly, to adaptive filters requiring fast convergence to a desired impulse response.

BACKGROUND OF THE INVENTION

Adaptive filters are filters which adjust their filter parameters to obtain a desired impulse response of an unknown system. Parameter adaptation is based on signals exciting the system and the signals which are the system's response. The adaptive filter generates an error signal reflecting the difference between the adaptive filter's actual impulse response and the desired impulse response. Adaptive filters have found application in diverse areas such as data communications, where they are used in data echo cancellers and equalizers; target tracking, where they are used in adaptive beam formers; and telephony, where they are used in speech coders and electrical and acoustic echo cancellers.

In adaptive filter design, a trade-off may exist between the speed of filter convergence (to a desired impulse response) and the computational complexity imposed on the processor implementing the filter. So, for example, conventional adaptive filters such as the affine projection adaptive filter (APAF) have been shown to achieve fast convergence at the expense of great computational complexity. Because of the complexity of these techniques the filter coefficients may not be updated as often as possible, that is, every sample period. Thus, the convergence of the adaptive filter coefficients is undesirably slowed.

SUMMARY OF THE INVENTION

The present invention provides an adaptive filter capable of frequent parameter updating (e.g., every sample period) and thus fast convergence with low complexity. Embodiments of the present invention mitigate APAF complexity due to matrix inversion and the fact that a given excitation vector is weighted and summed into the adaptive coefficient vector many times. An illustrative embodiment of the present invention achieves fast convergence through sample-by-sample updating with low complexity by exploiting the so-called "shift invariant" property of the filter excitation signal to simplify the matrix inverse and by a vector update procedure in which a given excitation vector is weighted and added into the coefficient vector estimate only once.

BRIEF DESCRIPTION OF THE DRAWINGS

FIG. 4 presents a detailed signal flow diagram of the $\hat{h}_n{}^{-1}$ Generator and Filter of FIG. 2;

FIG. 5 presents a detailed signal flow diagram of the $e_n$ Generator and Filter of FIG. 2;

DETAILED DESCRIPTION

A. Introduction

Figure 1:
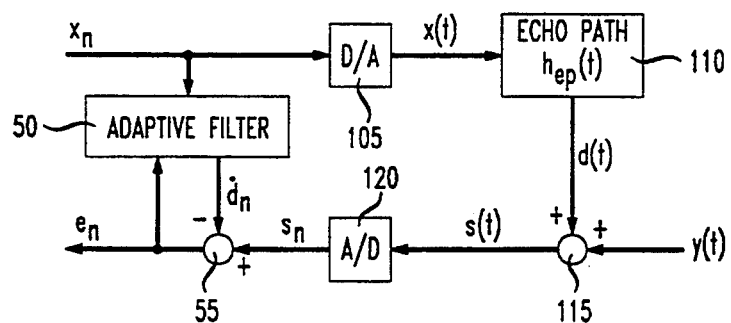
FIG. 1 presents an adaptive filter used in an acoustic echo canceller application.

FIG. 1 presents a block diagram of an adaptive filter 50 embedded in, for example, an echo canceller application. An incoming digitally sampled far-end excitation signal $x_n$ is supplied to the adaptive filter 50 and, to digital-to-analog (D/A) converter 105. D/A converter 105 converts the digitally sampled far-end signal $x_n$ to an analog form $x(t)$ in a conventional manner well-known to those skilled in the art. Far-end signal $x(t)$ is then applied to echo path 110 with analog impulse response $h_{ep}(t)$ producing the analog echo signal $d(t)$. In this example, echo path 110 can be either a long electrical path (such as that in a telecommunications network) or an acoustical path (such as that of a room). As such, echo cancellers may be used, e.g., in conjunction with a telecommunications network switch or a speaker phone. Analog summer 115 schematically represents the addition of echo $d(t)$ to the near-end signal $y(t)$. The near-end signal $y(t)$ consists of a high level near-end talker signal which is sometimes present and/or a (usually) low level near-end background-noise which is always present. The output of schematic analog summer 115 is the overall analog system response signal $s(t)$ which is applied to the adaptive filter 50 via analog-to-digital converter 120. Signal $S_n$ is the digitally sampled version of the overall analog system response signal $s(t)$. For purposes of presentation clarity, the analog echo path impulse response $h_{ep}(t)$, analog echo signal, $d(t)$, and analog near-end signal $y(t)$ will be replaced in the remainder of the detailed description with their digitally sampled counterparts, vector $\underline{h}_{ep}$, digital signal $d_n$, and digital signal $y_n$, respectively, in a manner familiar to those skilled in the art. Adaptive filter 50 generates return signal $e_n$ by subtracting the echo estimate, $\hat{d}_n$ from the system response, $s_n$. The return signal $e_n$ is then sent to the far-end and supplied to the adaptive filter 50 which uses it to adjust its coefficients. Return signal $e_n$ comprises the sampled near-end signal $y_n$ and, when the adaptive filter 50 is not yet converged, a residual of uncancelled echo.

1. The Affine Projection Adaptive Filter

The affine projection adaptive filter (APAF) (K. Ozeki, T. Umeda, "An Adaptive Filtering Algorithm Using an Orthogonal Projection to an Affine Subspace and Its Properties," Electronics and Communications in Japan, Vol. 67-A, No. 5, 1984) in a relaxed and regularized form, is defined by the following two equations:

$$\underline{e}_n = \underline{s}_n - X_n{}^t \underline{h}_{n-M} \tag{1}$$

$$\underline{h}_n = \underline{h}_{n-M} + \mu X_n [X_n{}^t X_n + \delta I]^{-1} \underline{e}_n \tag{2}$$

This is a block adaptive filter where the block size is N. The excitation signal matrix, $X_n$, is of dimension L by N and has the structure, $$X_n = [\underline{x}_n, \underline{x}_{n-1}, \ldots \underline{x}_{n-(N-1)}] \quad (3)$$

where $\underline{x}_n$ is the L-length excitation vector of the filter at sample period n defined as $\underline{x}_n = [x_n, \ldots x_{n-L+1}]^t$ (where superscript "t" indicates a transpose). The adaptive tap weight vector is $\underline{h}_n = [h_{0,n}, \ldots, h_{L-1,n}]$, where $h_{i,n}$ is the $i^{th}$ tap weight at sample n. The N-length return signal vector is defined as $\underline{e}_n = [e_n, \ldots e_{n-N+1}]^t$, the N-length system output vector is defined as $\underline{s}_n = [s_n, \ldots s_{n-N+1}]^t$, and is the sum of the N-length echo estimate vector $\underline{d}_n = [d_n, \ldots d_{n-N+1}]^t$ and the N-length near-end signal vector, $\underline{y}_n = [y_n, \ldots y_{n-N+1}]^t$, $$\underline{s}_n = \underline{d}_n + \underline{y}_n = X_n^t \underline{h}_{ep} + \underline{y}_n \quad (4)$$

The step-size parameter, $\mu$ is a relaxation factor. The adaptive filter is stable for $0 < \mu < 2$.

The scalar $\delta$ is the regularization parameter for the autocorrelation matrix inverse. Where $X_n^t X_n$ may have eigenvalues close to zero, creating problems for the inverse, $X_n^t X_n + \delta I$ has $\delta$ as its smallest eigenvalue which, if large enough, yields a well behaved inverse.

At each iteration, the signal in the adaptive filter moves forward by M samples. In practical implementations, M is set to the block size, N, to mitigate the $O(N^2)$ computational complexity of the calculation of the vector $$\underline{\epsilon}_n = [X_n^t X_n + \delta I]^{-1} \underline{e}_n \quad (5)$$

$$\underline{\epsilon}_n = [\epsilon_{0,n}, \ldots, \epsilon_{N-1,n}]^t \quad (6)$$

(S. G. Kratzer, D. R. Morgan, "The Partial-Rank Algorithm for Adaptive Beamforming," SPIE Vol. 564 Real Time Signal Processing VIII, 1985; and P. C. W. Soremen, "Adaptive Filtering Methods," Ph.D. Dissertation, Technische Universiteit Eindhoven, June 1992). However faster convergence and/or a lower converged system misadjustment can be achieved if M is set to a lower value.

2. Projections Onto An Affine Subspace and Convergence

By manipulating equations (1), (2), and (4), and assuming that $\delta$ is small enough to be ignored and the additive system noise, $\underline{y}_n$ is zero, the APAP tap update can be expressed as, $$\underline{h}_n = Q_n \underline{h}_{n-M} + O_n \underline{h}_{ep} \quad (7)$$

where $$Q_n = I - \mu X_n [X_n^t X_n]^{-1} X_n^t \quad (8)$$
$$= U_n \text{diag}\{1-\mu, \ldots, 1-\mu, 1, \ldots, 1\} U_n^t,$$
$$P_n = I - Q_n, \quad (9)$$

and the diagonal matrix in (8) has $N(1-\mu)$'s and $L-N$ 1's along the diagonal. The matrices, $Q_n$ and $P_n$ represent projection matrices onto orthogonal subspaces when $\mu = 1$ and relaxed projection matrices when $0 < \mu < 1$. Thus (7), and therefore (1) and (2), represent the (relaxed) projection of $\underline{h}_{m-M}$ onto the affine subspace defined by the (relaxed) linear projection matrix, $Q_n$, and the offset vector, $P_n \underline{h}_{ep}$.

Equation (7) provides insight into the convergence of $\underline{h}_n$ to $\underline{h}_{ep}$. Assume that $\mu = 1$. As N increases from 1 toward L, the contribution to $\underline{h}_n$ from $\underline{h}_{n-M}$ decreases because the nullity of $Q_n$ is increasing, while the contribution from $\underline{h}_{ep}$ increases because the rank of $P_n$ is increasing. In principle, when $N = L, \underline{h}_n$ should converge to $\underline{h}_{ep}$ in one step, since $Q_n$ has a rank of zero and $P_n$ a rank of L. In practice however, as N approaches L the condition number of the matrix, $X_n^t X_n$ begins to grow. As a result, the inverse of $X_n^t X_n$ becomes more and more dubious and must be replaced with either a regularized or pseudo-inverse.

3. The Connection Between APAF, Least Squares Adaptive Filter, and RLS

Using the matrix inversion lemma the APAF tap update described in (2) can be written as $$\underline{h}_n = \underline{h}_{n-M} + \mu [X_n X_n^t + \delta I]^{-1} X_n \underline{e}_n \quad (10)$$

(S. G. Kratzer, D. R. Morgan, "The Partial-Rank Algorithm for Adaptive Beamforming," SPIE, Vol. 564, Real Time Signal Processing VIII, 1985). Note that $X_n X_n^t$ is an L by L rank deficient estimate of the autocorrelation matrix and that its inverse is regularized by the matrix $\delta I$. Consider the case where the sample advance, M, is one and consider the vector $\underline{e}_n$. By definition, $$\underline{e}_n = \underline{s}_n - X_n^t \underline{h}_{n-1} = \begin{bmatrix} s_n - \underline{x}_n^t \underline{h}_{n-1} \\ \underline{\bar{s}}_{n-1} - \overline{X}_{n-1}^t \underline{h}_{n-1} \end{bmatrix}. \quad (11)$$

Where the matrix $\overline{X}_{n-1}$ has dimension L by $(N-1)$ and consists of the $N-1$ left-most (newest) columns of $X_{n-1}$ and the $N-1$ length vector $\underline{\bar{s}}_{n-1}$ consists of the $N-1$ upper (newest) elements of the vector $\underline{s}_{n-1}$.

First, consider the lower $N-1$ elements of (11). Define the a posteriori return signal vector for sample period $n-1$, $\underline{e}_{1,n-1}$ as $$\begin{aligned} \underline{e}_{1,n-1} &= \underline{s}_{n-1} - X_{n-1}^t \underline{h}_{n-1} \\ &= [I - \mu X_{n-1}^t X_{n-1} [X_{n-1}^t X_{n-1} + \delta I]^{-1}] \underline{e}_{n-1}. \end{aligned} \quad (12)$$

Now make the approximation, $$X_{n-1}^t X_{n-1} + \delta I \approx X_{n-1}^t X_{n-1} \quad (13)$$

which is valid as long as $\delta$ is significantly smaller than the eigenvalues of $X_{n-1}^t X_{n-1}$. Of course, this means that $\delta I$ no longer regularizes the inverse of the N by N sample autocorrelation matrix. However it still regularizes the rank deficient L by L sample autocorrelation matrix inverse of (10). Using this approximation, $$\underline{e}_{1,n-1} \approx (1-\mu) \underline{e}_{n-1} \quad (14)$$

Recognizing that the lower $N-1$ elements of (11) are the same as the upper $N-1$ elements of (12), (14) can be used to express $\underline{e}_n$ as $$\underline{e}_n \approx \begin{bmatrix} s_n - \underline{x}_n^t \underline{h}_{n-1} \\ (1-\mu) \underline{\bar{e}}_{n-1} \end{bmatrix} = \begin{bmatrix} e_n \\ (1-\mu) \underline{\bar{e}}_{n-1} \end{bmatrix}. \quad (15)$$

Where $\underline{\bar{e}}_{n-1}$ is an $N-1$ length vector containing the uppermost elements of $\underline{e}_{n-1}$. For $\mu = 1$, $$\underline{e}_n \approx \begin{bmatrix} e_n \\ 0 \end{bmatrix}. \tag{16}$$

Using (16) in (10), $$\underline{h}_n = \underline{h}_{n-1} + [X_n X_n^t + \delta I]^{-1} X_n e_n \tag{17}$$

Equation (17) is a regularized, rank deficient least squares tap update. If $N=n$, $\delta=0$, and the matrix inversion lemma is applied to a rank-one update of the inverted matrix in (17), (17) becomes the growing windowed RLS adaptive filter.

Indeed, equation (17) can be used as an alternative starting point to our adaptive filter of the present invention and FAP adaptive filmring (with $\mu=1$) can be thought of as a fast, regularized, rank deficient least squares adaptive filter. One advantage of this interpretation is that (10) may be obtained from (17) where an alternative definition for $e_n$, namely $$\underline{e}_n = \begin{bmatrix} e_n \\ \underline{0} \end{bmatrix}$$

is used. As a side benefit, this obviates the need for the approximation in (13) and $\delta$ can once again be chosen large enough to regularize small eigenvalues in $X_n^t X_n$. While the two adaptive filter represented by relations (2) and (17) are slightly different, they yield the same convergence curves with only a modification of the parameter $\delta$.

4. The Fast Affine Projection (FAP) Adaptive Filter

In echo cancellation the return signal vector, $e_n$, is the directly observed part of the adaptive filter, while the adaptive filter taps, $h_n$ are not directly observed. Therefore, it is permissible to maintain any form of $h_n$ that is convenient in the adaptive filter, as long as the first sample of $e_n$ is not modified in any way from that of equation (1). In the illustrative filters, the fidelity of $e_n$ is maintained at each sample period, but $h_n$ is not. Another vector, called the provisional echo path estimate $\hat{h}_n$ is maintained instead. The provisional echo path estimate $\hat{h}_n$ is formed using only the last column of $X_n, X_{n-N+1}$, weighted and accumulated into $\hat{h}_{n-1}$ each sample period. The proper weighting factor, $\mu E_{N-1,n}$ is found below. This is N times less complex than the weighting and accumulating all N columns of $X_n$ as is done in equation (2) for the $h_n$ update.

Using (5) in (2) the APAF tap update can be expressed as, $$\underline{h}_n = \underline{h}_{n-1} + \mu X_n \underline{\delta}_n \tag{18}$$

The current echo path estimate, $\underline{h}_n$, may be expressed in terms of the original echo path estimate, $\underline{h}_0$, and the subsequent $X_i$'s and $\underline{\delta}_i$'s, $$\underline{h}_n = \underline{h}_0 + \mu \sum_{i=0}^{n-1} X_{n-i} \underline{\epsilon}_{n-i}. \tag{19}$$

The vector/matrix multiplication may be expanded, $$\underline{h}_n = \underline{h}_0 + \mu \sum_{i=0}^{n-1} \sum_{j=0}^{N-1} x_{n-j-i} \epsilon_{j,n-i}. \tag{20}$$

Assuming that $x_n = 0$ for $n \leq 0$, (20) can be rewritten as, $$\underline{h}_n = \underline{h}_0 + \mu \sum_{k=0}^{N-1} x_{n-k} \sum_{j=0}^{k} \epsilon_{j,n-k+j} + \tag{21}$$

$$\mu \sum_{k=N}^{n-1} x_{n-k} \sum_{j=0}^{N-1} \epsilon_{j,n-k+j}.$$

If the first term and the second pair of summations on the right side of (21) are defined as $$\hat{\underline{h}}_{n-1} = \underline{h}_0 + \mu \sum_{k=N}^{n-1} x_{n-k} \sum_{j=0}^{N-1} \epsilon_{j,n-k+j} \tag{22}$$

and the first pair of summations in (21) is recognized as a vector-matrix multiplication, $$X_n \underline{E}_n = \mu \sum_{k=0}^{N-1} x_{n-k} \sum_{j=0}^{k} \epsilon_{j,n-k+j} \tag{23}$$

where, $$\underline{E}_n = \begin{bmatrix} \epsilon_{0,n} \\ \epsilon_{1,n} + \epsilon_{0,n-1} \\ \vdots \\ \epsilon_{N-1,n} + \epsilon_{N-2,n-1} + \cdots + \epsilon_{0,n-(N-1)} \end{bmatrix} \tag{24}$$

then, (21) can be expressed as $$\underline{h}_n = \hat{\underline{h}}_{n-1} + \mu X_n \underline{E}_n \tag{25}$$

It is seen from (22) that $$\hat{\underline{h}}_n = \hat{\underline{h}}_{n-1} + \mu x_{n-(N-1)} \sum_{j=0}^{N-1} \epsilon_{j,n-N+1+j} \tag{26}$$

$$= \hat{\underline{h}}_{n-1} + \mu x_{n-(N-1)} E_{N-1,n} \tag{27}$$

Using (27) in (25) the current echo path estimate can alternately be expressed as $$\underline{h}_n = \hat{\underline{h}}_n \mu \bar{X}_n \bar{E}_n \tag{28}$$

Where $\bar{E}_n$ is an $N-1$ length vector consisting of the upper most $N-1$ elements of $\underline{E}_n$. The vector $\hat{\underline{h}}_n$ is the provisional echo path estimate.

Observing (24) it is seen that $\underline{E}_n$ can also be calculated recursively. By inspection, $$\underline{E}_n = \underline{\epsilon}_n + \begin{bmatrix} 0 \\ \bar{E}_{n-1} \end{bmatrix}. \tag{29}$$

Now, consider the relationship between $\underline{e}_n$ and $\underline{e}_{n-1}$. From equation (15) it is apparent that the only real difficulty in calculating $\underline{e}_n$ from $\underline{e}_{n-1}$ is in calculating $e_n$ since $\underline{h}_{n-1}$ is not readily available. By definition, $$e_n = s_n - \dot{d}_n \tag{30}$$

Using (28) for $\underline{h}_{n-1}$ in the definition of $\dot{d}_n$ yields $$d_n = \underline{x}_n^t \underline{\hat{h}}_{n-1} \quad (31)$$
$$= \hat{d}_n + \mu \tilde{r}_{xx,n} \overline{E}_{n-1}$$

where $\hat{d}_n$ is the provisional echo estimate produced by the response of the provisional echo path estimate, $\underline{\hat{h}}_{n-1}$ from the excitation vector, $\underline{x}_n$, $$\hat{d}_n = \underline{x}_n^t \underline{\hat{h}}_{n-1} \quad (32)$$

and the correlation vector, $\tilde{r}_{xx,n}$ is defined as, $$\tilde{r}_{xx,n} = \tilde{r}_{xx,n-1} + x_n \tilde{\underline{a}}_n - x_{n-L} \tilde{\underline{a}}_{n-L} \quad (33)$$

and $$\tilde{\underline{a}}_n = x_{n-1}, \ldots, x_{n-N+1}]^t$$

To efficiently compute (29) a recursion for the vector, $\underline{\epsilon}_n$ is needed. Define $R_n = X_n^t X_n + \delta I$ and let $\underline{a}_n$ and $\underline{b}_n$ denote the optimum forward and backward linear predictors for $R_n$ and let $E_{a,n}$ and $E_{b,n}$ denote their respective expected prediction error energies. Also, define $\overline{R}_n$ and $\tilde{R}_n$ as $N-1$ by $N-1$ matrices consisting of the upper left and lower right corners of $R_n$, respectively. Then, given the following identities:

$$R_n^{-1} = \begin{bmatrix} 0 & \underline{0}^t \\ \underline{0} & \tilde{R}_n^{-1} \end{bmatrix} + \frac{1}{E_{a,n}} \underline{a}_n \underline{a}_n^t \quad (34)$$

$$= \begin{bmatrix} \overline{R}_n^{-1} & \underline{0} \\ \underline{0}^t & 0 \end{bmatrix} + \frac{1}{E_{b,n}} \underline{b}_n \underline{b}_n^t \quad (35)$$

and the definitions, $$\underline{\epsilon}_n = R_n^{-1} \underline{e}_n \quad (36)$$

(where $\underline{e}_n$ is an $N-1$ length vector containing the $N-1$ lower elements of $\underline{e}_n$) and $$\underline{\tilde{\epsilon}}_n = \tilde{R}_n^{-1} \underline{\tilde{e}}_n \quad (37)$$

one can multiply (34) from the right by $e_n$ and use (5) and (36) to obtain, $$\underline{\epsilon}_n = \begin{bmatrix} 0 \\ \underline{\tilde{\epsilon}}_n \end{bmatrix} + \frac{1}{E_{a,n}} \underline{a}_n \underline{a}_n^t \underline{e}_n. \quad (38)$$

Similarly, multiplying (35) from the right by $\underline{e}_n$, using (5) and (37), and solving for $$\begin{bmatrix} \overline{\epsilon}_n \\ 0 \end{bmatrix}, \quad (39)$$

$$\begin{bmatrix} \overline{\epsilon}_n \\ 0 \end{bmatrix} = \underline{\epsilon}_n - \frac{1}{E_{b,n}} \underline{b}_n \underline{b}_n^t \underline{e}_n.$$

The quantities, $E_{a,n}$, $E_{b,n}$, $\underline{a}_n$, and $\underline{b}_n$ can be calculated efficiently (complexity $10N$) using a conventional sliding windowed fast recursive least squares (FRLS) adaptive filter (J. M. Cioffi, T. Kailath, "Windowed Fast Transversal Filters Adaptive Algorithms with Normalization," IEEE Transactions on Acoustics, Speech and Signal Processing, Vol. ASSP-33, No. 3, June 1985; and A. Houacine, "Regularized Fast Recursive Least Squares Algorithms for Adaptive Filtering," IEEE Trans. Signal Processing, Vol. 39, No. 4, April. 1991).

The relationship between $\underline{\tilde{\epsilon}}_n$ and $\overline{\epsilon}_{n-1}$ is now investigated. It can be shown that $$\tilde{R}_n = \overline{R}_{n-1} \quad (40)$$

Using (40), the definition $\underline{\tilde{\epsilon}}_n$, $\overline{\epsilon}_n$, (36), (37), and (15) we have, $$\underline{\tilde{\epsilon}}_n = \tilde{R}_n \underline{\tilde{e}}_n$$
$$= \overline{R}_{n-1}(1-\mu)\overline{\epsilon}_{n-1} = (1-\mu)\overline{\epsilon}_{n-1}.$$

B. Illustrative Embodiments for Use in Echo Cancellation

In this section, three illustrative FAP adaptive filters in accordance with the present invention are presented, one with relaxation, $0 < \mu < 1$, one without relaxation, $\mu = 1$, and one where the adaptation has been suspended. In all three cases, the sample advance, M, is set to one.

For clarity of explanation, the illustrative embodiments of the present invention are presented as comprising individual functional blocks. The functions these blocks represent may be provided through the use of either shared or dedicated hardware, including, but not limited to, hardware capable of executing software. For example, the functions of processors presented in FIGS. 2 and 7 may be provided by a single shared processor. (Use of the term "processor" should not be construed to refer exclusively to hardware capable of executing software.)

Illustrative embodiments may comprise digital signal processor (DSP) hardware, such as the AT&T DSP16 or DSP32C, read-only memory (ROM) for storing software performing the operations discussed below, and random access memory (RAM) for storing DSP results. Very large scale integration (VLSI) hardware embodiments, as well as custom VLSI circuitry in combination with a general purpose DSP circuit, may also be provided.

1. Relaxed FAP Adaptive Filter

A first illustrative embodiment of the present invention is directed to a relaxed FAP adaptive filter. The filter process in accordance with this embodiment is summarized as follows:

1. Initialization: $\underline{a}_0 = [1, \underline{0}^t]^t$, $\underline{b}_0 = [\underline{0}^t, 1]^t$, and $E_{a,n} = E_{b,n} = \delta$.
2. Use sliding windowed Fast Kalman or Fast Transversal Filters to update $E_{a,n}$, $E_{b,n}$, $\underline{a}_n$, and $\underline{b}_n$.
3. $\tilde{r}_{xx,n} = \tilde{r}_{xx,n-1} + x_n \tilde{\underline{a}}_n - x_{n-L} \tilde{\underline{a}}_{n-L}$
4. $\hat{d}_n = \underline{x}_n^t \underline{\hat{h}}_{n-1}$
5. $\dot{d}_n = \hat{d}_n + \mu \tilde{r}_{xx,n} \overline{E}_{n-1}$, $e_n = s_n - \dot{d}_n$ 6. $\underline{e}_n = \begin{bmatrix} e_n \\ (1-\mu)\overline{\epsilon}_{n-1} \end{bmatrix}$ 7. $\underline{\epsilon}_n = \begin{bmatrix} 0 \\ \underline{\tilde{\epsilon}}_n \end{bmatrix} + \frac{1}{E_{a,n}} \underline{a}_n \underline{a}_n^t \underline{e}_n$ -continued 8. $\left[\dfrac{\bar{\epsilon}_n}{0}\right] = \underline{\epsilon}_n - \dfrac{1}{E_{b,n}} \underline{b}_n \underline{b}_n{}^t \underline{\epsilon}_n$ 9. $\underline{E}_n = \left[\begin{array}{c} 0 \\ \underline{E}_{n-1} \end{array}\right] + \underline{\epsilon}_n$ 10. $\hat{\underline{h}}_n = \hat{\underline{h}}_{n-1} + \mu \underline{x}_{n-(N-1)} E_{N-1,n}$ 11. $\bar{\underline{e}}_{n+1} = (1-\mu)\bar{\underline{e}}_n$ Step 2 is of complexity 10N when FTF is used. Steps 4 and 10 are both of complexity L, steps 3, 7, and 8 are each of complexity 2N, and steps 5, 6, 9 and 11 are of complexity N. This gives an overall complexity of 2L+20N.

Figure 2:
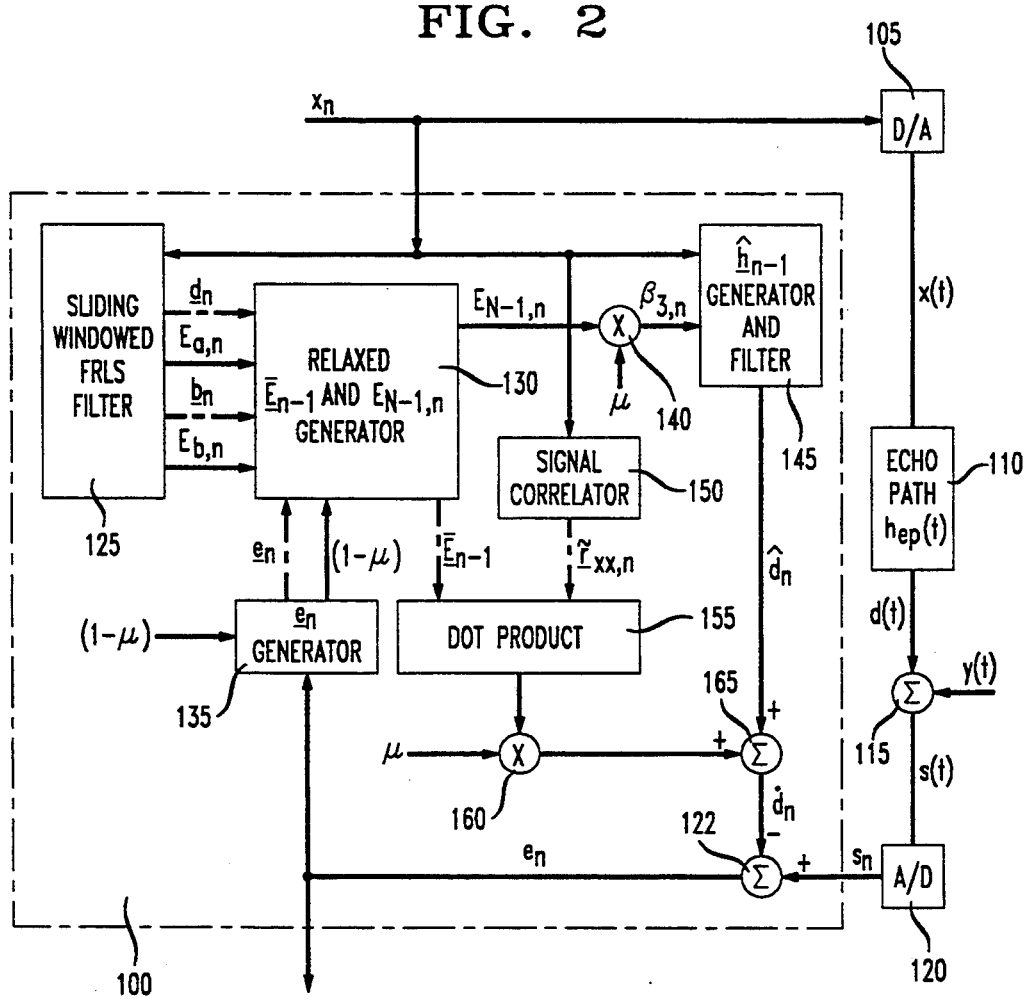
FIG. 2 presents a first illustrative embodiment of the present invention in an acoustic echo canceller application.

FIG. 2 presents the first illustrative embodiment of the present invention with relaxation in the context of an echo canceller. The far-end or "excitation" signal, $x_n$ is applied to a conventional sliding windowed fast recursive least squares (SW-FRLS) filter 125. SW-FRLS filter 125 produces in response, the forward prediction coefficient vector $a_n$, the forward prediction error energy $E_{a,n}$, the backward prediction coefficient vector $b_n$, and the backward prediction error energy $E_{b,n}$ as is conventional. These output signals are in turn applied to relaxed $\bar{E}_{n-1}$ and $E_{N-1,n}$ generator 130 (discussed below in connection with FIG. 3). Also applied to relaxed $\bar{E}_{n-1}$ and $E_{N-1,n}$ generator 130 is parameter $1-\mu$ and the return signal vector $e_n$ which is produced by $e_n$ generator 135. Relaxed $\bar{E}_{n-1}$ and $E_{N-1,n}$ generator 130 produces the scalar output $E_{N-1,n}$ and the vector output $\bar{E}_{n-1}$. The scalar $E_{N-1,n}$ is multiplied by the relaxation factor $\mu$ by multiplier 140 creating signal $\beta_{3,n}$ which is then applied to $\hat{h}_n{}^{-1}$ generator and filter 145 (discussed below in connection with FIG. 4). The excitation signal $x_n$ is also applied to $\hat{h}_n{}^{-1}$ generator and filter 145 which produces the provisional echo estimate signal $\hat{d}_n$. Signal correlator 150 receives signal $x_n$ as input and produces in response correlation vector $\bar{r}_{xx,n}$ which is in turn applied to dot product generator 155. Vector $\bar{E}_{n-1}$ from relaxed $\bar{E}_{n-1}$ and $E_{N-1,n}$ generator 130 is also supplied to dot product generator 155 whose scalar output is multiplied by relaxation factor $\mu$ by multiplier 160. The output of multiplier 160 is supplied to summer 165 where it is added to provisional echo estimate $\hat{d}_n$ producing echo estimate $\hat{d}_n$. Echo estimate $\hat{d}_n$ is then subtracted from system response signal $s_n$ by summer 122, producing return signal $e_n$. Return signal $e_n$ is returned to the far-end as output and is also supplied to $e_n$ generator 135. The scalar quantity $1-\mu$ is also supplied to $e_n$ generator 135 which produces the return signal vector $e_n$ for input into relaxed $\bar{E}_{n-1}$ and $E_{N-1,n}$ generator 130.

Figure 3:
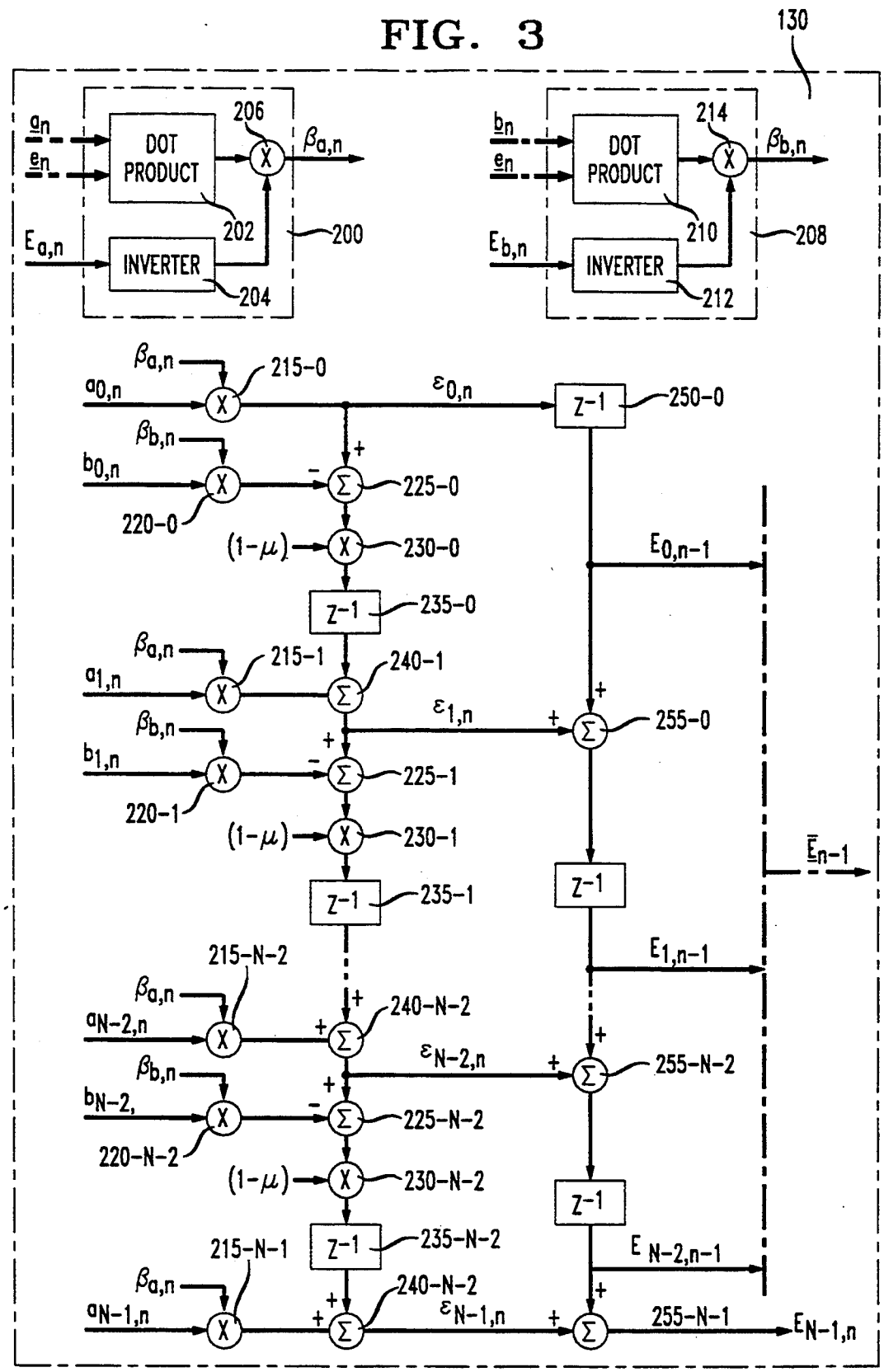
FIG. 3 presents a detailed signal flow diagram of the Relaxed $\bar{E}_{N-1,n}$ and $E_{N-1,n}$ Generator of FIG. 2.

FIG. 3 shows the signal flow diagram of relaxed $\bar{E}_{n-1}$ and $E_{N-1,n}$ generator 130 of FIG. 2. Input forward linear prediction vector $a_n$ and return signal vector $e_n$ from filter 125 are supplied to dot product generator 202. Also, forward prediction error energy $E_{a,n}$, also from filter 125, is supplied to inverter 204. The outputs of dot product generator 202 and inverter 204 are supplied to multiplier 206 which produces signal $\beta_{a,n}$. Input backward linear prediction vector $b_n$ and return signal vector $e_n$ are supplied to dot product generator 210 from filter 125. Also, backward prediction error energy $E_{b,n}$ is supplied to inverter 212 also from filter 125. The outputs of dot product generator 210 and inverter 212 are supplied to multiplier 214 which produces signal $\beta_{b,n}$. The N elements of forward prediction vector $a_n$ are denoted as elements $a_{0,n}$ through $a_{N-1,n}$. Similarly, the N elements of backward prediction vector $b_n$ are denoted as elements $b_{0,n}$ through $b_{N-1,n}$. Forward linear prediction vector element $a_{0,n}$ is multiplied by signal $\beta_{a,n}$ at multiplier 215-0. The output of multiplier 215-0 is signal $\epsilon_{0,n}$. Signal $\epsilon_{0,n}$ is the first element of the N-length signal vector $\epsilon_n$ which has elements $\epsilon_{0,n}$ to $\epsilon_{N-1,n}$. Elements $\epsilon_{k,n}$ of signal vector $\epsilon_n$ where $0 < k < N-1$ are produced in the following manner. Backward linear prediction vector element $b_{k-1,n}$ and signal $\epsilon_{b,n}$ are supplied to multiplier 220-k-1 whose output is summed with $\epsilon_{k-1,n}$ at summer 225-k-1. The output of summer 225-k-1 is then multiplied by the factor $1-\mu$ at multiplier 230-k-1 and the result is sent to sample delay memory element 235-k-1. Forward linear prediction vector element $a_{k,n}$ is multiplied by signal $\beta_{a,n}$ at multiplier 215-k and the result is summed with the output of sample delay memory element 235-k-1 at summer 240-k whose output is $\epsilon_{k,n}$.

The $N-1$ length vector $\bar{E}_{n-1}$ is formed from the first $N-1$ elements of $\epsilon_n$, $\epsilon_{0,n}$ through $\epsilon_{N-2,n}$ in the following manner. The first element of vector $\bar{E}_{n-1}$, $E_{0,n-1}$ is formed by delaying $\epsilon_{0,n}$ one sample period in sample delay memory element 250-0. Then elements $E_{k,n-1}$ where $0 < k \leq N-2$ are formed by adding $E_{k-1,n-1}$ to $\epsilon_{k,n}$ at summer 255-k-1, applying the result to sample delay memory element 250-k, the output of which is $E_{k,n-1}$. Finally, output $E_{N-1,n}$ is formed by adding $\epsilon_{N-1,n}$ to $E_{N-2,n-1}$ at summer 255-N-1.

FIG. 4 shows $\hat{h}_n{}^{-1}$ generator and filter 145 of FIG. 1. $\hat{h}_n{}^{-1}$ generator and filter 145 consists of $\hat{h}_n{}^{-1}$ generator 301 and filter 326. The inputs to $\hat{h}_n{}^{-1}$ generator are excitation signal $x_n$ and signal $\beta_{3,n}$. Excitation signal $x_n$ is supplied to $N-2$ sample delay memory element 305 whose output is $x_{n-N+2}$. Signal $x_{n-N+2}$ is supplied to signal delay memory elements 310 whose outputs are $x_{n-N+1}$ through $x_{n-L-N+2}$ which are the elements of the signal vector $\underline{x}_{n-N+1}$. Signal vector $\underline{x}_{n-N+1}$ is multiplied by input $\Theta_3$ at multipliers 315, the outputs of which are summed with the outputs of sample delay elements 320 at summers 325. The outputs of summers 325 are the provisional adaptive filter coefficients, $\hat{h}_n$ whose L elements are $\hat{h}_{0,n}$ through $\hat{h}_{L-1,n}$ which are in turn provided to sample delay elements 320. The outputs of sample delay elements 320 are the output of $\hat{h}_n{}^{-1}$ generator 301. The inputs to filter 326 are excitation signal $x_n$ and provisional echo path estimate $\hat{h}_n{}^{-1}$. Signal $x_n$ is supplied to signal delay memory elements 330 whose outputs are $x_{n-1}$ through $x_{n-L+1}$ which together with signal $x_n$ are the elements of the signal vector $\underline{x}_n$. Elements of vector $\underline{x}_n$ multiplied with elements of vector $\hat{h}_n{}^{-1}$ multipliers 335 the output of which are all summed together at summer 340. The output of summer 340 is the provisional echo estimate $\hat{d}_n$, the output of filter 326.

FIG. 5 shows $e_n$ generator 135 of FIG. 1. Return signal $e_n$ and parameter $1-\mu$ are inputs to $e_n$ generator 135. The output of $e_n$ generator is the N-length vector $e_n$ which consists of elements $e_{0,n}$ through $e_{N-1,n}$. Output element $e_{0,n}$ is simply signal $e_n$. Output elements $e_{k,n}$ for $0 < k \leq N-1$ are formed in the following manner. Output element $e_{k-1,n}$ is multiplied by parameter $1-\mu$ at multiplier 400-k-1 and the output of multiplier 400-k-1 is supplied to sample delay element 405-k-1 whose output is $e_{k,n}$.

Figure 6:
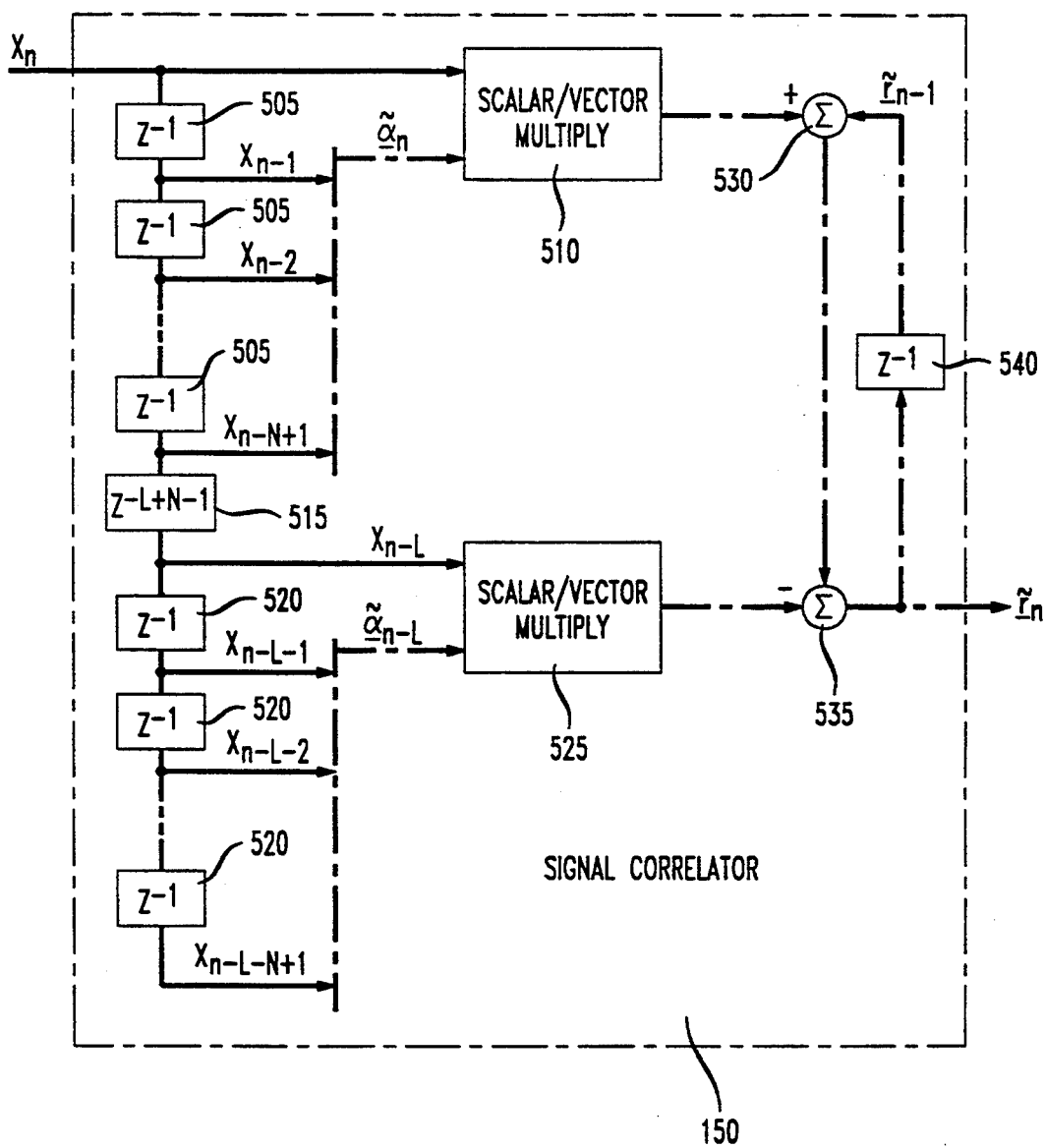
FIG. 6 presents a detailed signal flow diagram of the Signal Correlator of FIG. 2.

FIG. 6 shows signal correlator 150 of FIG. 1. The input to signal correlator 150 is the excitation signal $x_n$. Input signal $x_n$ is supplied to the $N-1$ sample delay elements 505 creating N−1 delayed outputs $x_{n-1}$ through $x_{n-N+1}$ which form the vector $\tilde{a}_n$. The vector $\tilde{a}_n$ is multiplied by signal $x_n$ in scale/vector multiplier 510. Signal $x_{n-+1}$ which is output from the last sample delay element 505 is supplied to L−N+1 sample delay element 515 whose output is signal $x_{n-L}$. Signal $x_{n-L}$ is supplied to the N−1 sample delay elements 520 creating N−1 delayed outputs $x_{n-L-1}$ through $x_{n-L-N+1}$ which form the vector $\tilde{a}_{n-L}$. The vector $\underline{a}_{n-L}$ is multiplied by signal $x_{n-L}$ in scalar/vector multiplier 525. The N−1 length output vector of scala/vector multiplier 510 is supplied to vector summer 530 which petrols an element to element summation of the output of scalar/vector multiplier 510 with the N−1 length vector $\tilde{r}_{n-1}$. The N−1 length vector output of vector summer 530 is then supplied to vector summer 535 where the N−1 length vector output of scalar/vector multiplier 525 is subtracted. The N−1 length output vector of vector summer 535 is signal correlator 150 output vector $\tilde{r}_n$. Vector $\tilde{r}_n$ is supplied to vector sample delay element 540. The output of vector sample delay element 540 is vector $\tilde{r}_{n-1}$.

2. FAP Adaptive Filter Without Relaxation

If relaxation of the first illustrative embodiment is eliminated (that is, if $\mu$ is set to one), considerable savings in complexity can be realized. A second illustrative embodiment of the present invention is directed to an FAP adaptive filter without relaxation. The filter process in accordance with the second embodiment is summarized as follows:

1. Initialization: $a_0 = [1, \underline{0}^t]^t$ and $E_{a,n} = \delta$.
2. Use sliding windowed Fast Kalman or Fast Transversal Filters to update $E_{a,n}$ and $a_n$.
3. $\tilde{r}_{xx,n} = \tilde{r}_{xx,n-1} + x_n \tilde{a}_n - x_{n-L} \tilde{a}_{n-L}$
4. $\hat{d}_n = \underline{x}_n^t \hat{\underline{h}}_{n-1}$
5. $\hat{d}_n = \hat{d}_n + \tilde{r}_{xx,n} \underline{E}_{n-1}$, $e_n = s_n - \hat{d}_n$ 6. $\underline{E}_n = \begin{bmatrix} 0 \\ \underline{E}_{n-1} \end{bmatrix} + \frac{e_n}{E_{a,n}} \underline{a}_n$ 7. $\hat{\underline{h}}_n = \hat{\underline{h}}_{n-1} + \underline{x}_{n-(N-1)} E_{N-1,n}$ Here, steps 4 and 7 are still complexity L, step 3 is of complexity 2N, and steps 5 and 6 are of complexity N. Taking into account the sliding windowed FTF, the total complexity is 2L+14N.

Figure 7:
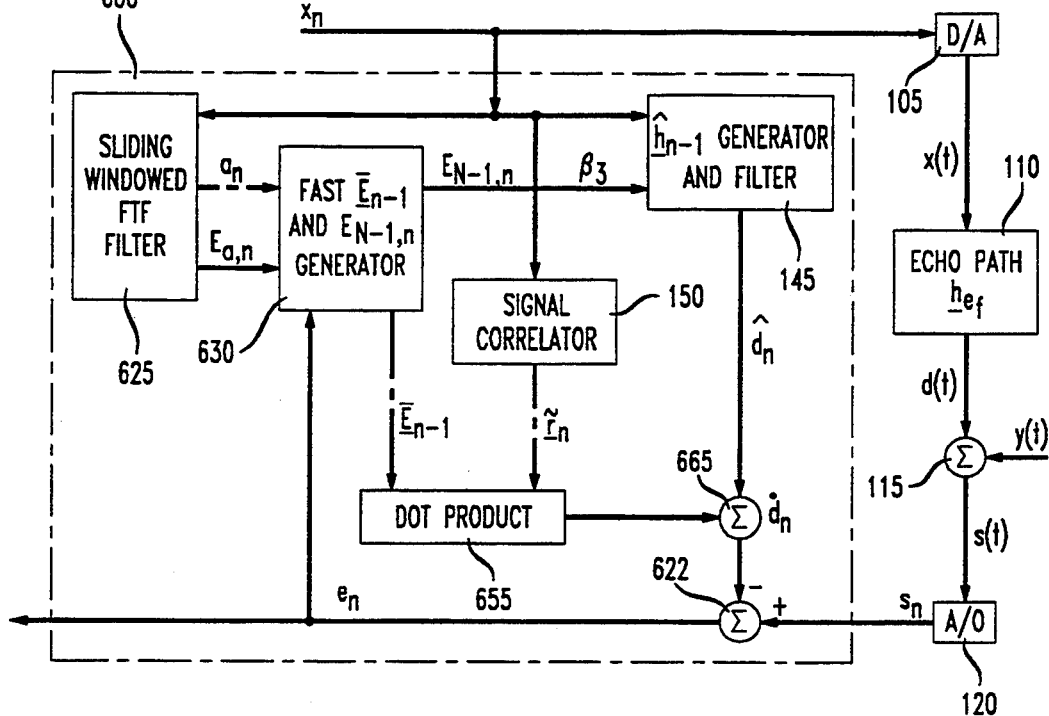
FIG. 7 presents a second illustrative embodiment of the invention in the context of an acoustic echo canceller application.

FIG. 7 presents the second illustrative embodiment of the invention, namely, FAP adaptive filter without relaxation 600 in the context of the echo canceller application. The inputs, outputs of FAP adaptive filter without relaxation 600 and its arrangement within the echo canceller example are the same as described in FIG. 1. Elements of the embodiment of FIG. 7 which are identical to those of FIG. 1 have been labeled with the same reference numerals.

The far-end or excitation signal, $x_n$ is applied to the well known sliding windowed fast recursive least squares (SW-FRLS) filter 625. SW-FRLS filter produces in response, the forward prediction coefficient vector $\underline{a}_n$ and the forward prediction error energy $E_{a,n}$ which in turn are applied to fast $\bar{E}_{n-1}$ and $E_{N-1,n}$ generator 630. Also applied to relaxed $\bar{E}_{n-1}$ and $E_{N-1,n}$ generator 630 is the return signal $e_n$. Fast $\bar{E}_{n-1}$ and $E_{N-1,n}$ generator 630 produces the scalar output $E_{N-1,n}$ and the vector output $\bar{E}_{n-1}$. The scalar $E_{N-1,n}$ is supplied to input $\beta_3$ of $\hat{\underline{h}}_n^{-1}$ generator and filter 145. The excitation signal $x_n$ is also applied to $\hat{\underline{h}}_n^{-1}$ generator and filter 145 which produces the provisional echo estimate signal $\hat{d}_n$. Signal correlator 150 receives signal x n as input and produces in response correlation vector $\tilde{r}_{xx,n}$. Vector $\tilde{r}_{xx,n}$ is in turn applied to dot product generator 655. Vector $\bar{E}_{n-1}$ from fast $\bar{E}_{n-1}$ and $E_{N-1,n}$ generator 630 is also supplied to dot product generator 655 whose scalar output is supplied to summer 665 where it is added to provisional echo estimate $\hat{d}_n$ producing echo estimate $\hat{d}_n$. Echo estimate $\hat{d}_n$ is then subtracted from system response signal $s_n$ by summer 622, producing return signal $e_n$. Return signal $e_n$ is returned to the far-end as output.

Figure 8:
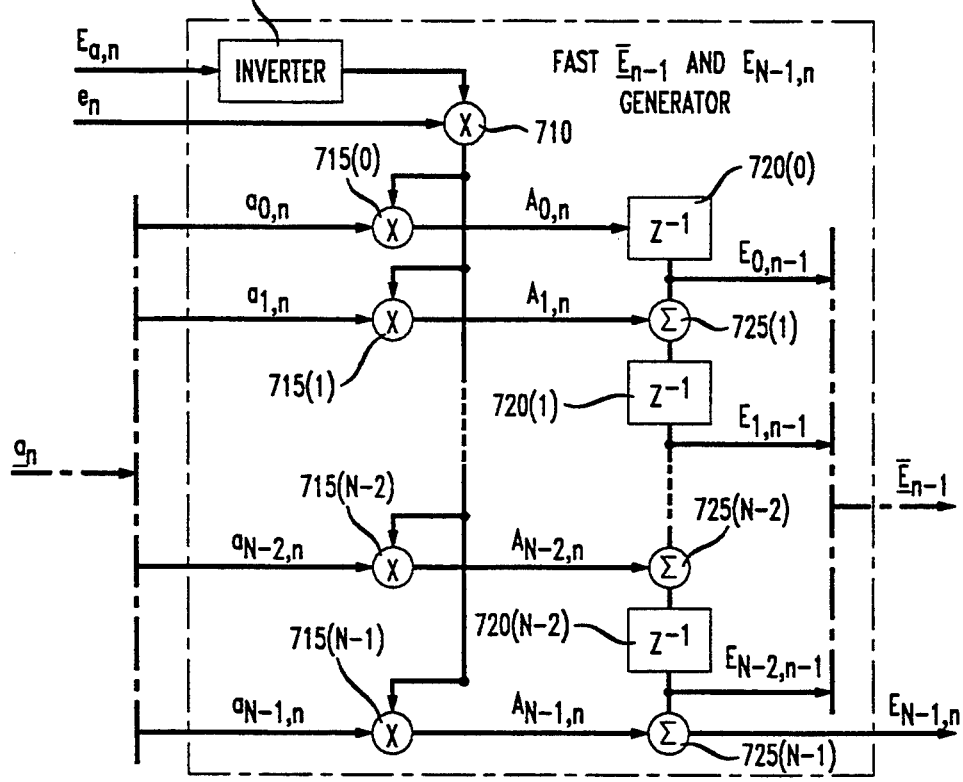
FIG. 8 presents a detailed signal flow diagram of the Fast $\bar{E}_{N-1,n}$ and $E_{N-1,n}$ Generator of FIG. 2.

FIG. 8 shows the signal flow graph of fast $\bar{E}_{n-1}$ and $E_{N-1,n}$ generator 630 of FIG. 7. The inputs to Fast $\bar{E}_{n-1}$ and $E_{N-1,n}$ are the expected forward prediction error energy $E_{a,n}$, the return signal $e_n$, and the forward prediction vector $\underline{a}_n$. The expected forward prediction error energy $E_{N-1,n}$ is supplied to inverter 705 which inverts $E_{a,n}$ and supplies the output to multiplier 710. Multiplier 710 multiplies inverted $E_{a,n}$ with returned error signal $e_n$. The output of multiplier 710 then is supplied to multipliers 715 which multiply the output of multiplier 710 with the N elements of forward prediction vector an resulting in the N-length output vector $\underline{A}_n$. Vector $\underline{A}_n$ vector elements $A_{0,n}$ through $A_{N-1,n}$. The N−1 length vector $\bar{E}_{n-1}$ is formed from the first N−1 elements of $\underline{A}_n$, $A_{0,n}$ through $A_{N-2,n}$ in the following manner. The first element of vector $\bar{E}_{n-1}$, $E_{0,n-1}$ formed by delaying $A_{0,n}$ one sample period in sample delay memory element 720-0. Then elements $E_{k,n-1}$ where $0 < k \leq N-2$, are formed by adding $E_{k-1,n-1}$ to $A_{k,n}$ at summer 725-k-1 and applying the result to sample delay element 720-k (the output of which is $E_{k,n-1}$). Finally, output $E_{N-1,n}$ is formed by adding $A_{N-1,n}$ to $E_{N-2,n-1}$ at summer 725-N-1.

3. FAP Adaptive Filter With Suspended Adaptation

Consider the case where the relaxation parameter, $\mu$, is set to zero. From equation (2) it is seen that this is equivalent to suspending the coefficient adaptation. This is desirable in echo cancellation applications when a signal source, such as a near-end talker, is active in the echo path. Setting $\mu = 0$ in the first illustrative embodiment obtains a third illustrative embodiment directed to suspended coefficient adaptation. The filter process associated with this third illustrative embodiment is summarized as follows:

1. Initialization: $a_0 = [1, \underline{0}^t]^t$, $b_0 = [\underline{0}^t, 1]^t$, and $E_{a,n} = E_{b,n} = \delta$.
2. Use sliding windowed Fast Kalman or Fast Transversal Filters to update $E_{a,n}$, $E_{b,n}$, $a_n$, and $b_n$.
3. $\tilde{r}_{xx,n} = \tilde{r}_{xx,n-1} + x_n \tilde{a}_n - x_{n-L} \tilde{a}_{n-L}$
4. $\hat{d}_n = \underline{x}_n^t \hat{\underline{h}}_{n-1}$
5. $\hat{d}_n = \hat{d}_n$, $e_n = s_n - \hat{d}_n$ 6. $\underline{e}_n = \begin{bmatrix} e_n \\ \underline{\bar{e}}_{n-1} \end{bmatrix}$ 7. $\underline{\varepsilon}_n = \begin{bmatrix} 0 \\ \underline{\tilde{\varepsilon}}_n \end{bmatrix} + \frac{1}{E_{a,n}} \underline{a}_n \underline{a}_n^t \underline{e}_n$ 8. $\begin{bmatrix} \underline{\tilde{\varepsilon}}_n \\ 0 \end{bmatrix} = \underline{\varepsilon}_n - \frac{1}{E_{b,n}} \underline{b}_n \underline{b}_n^t \underline{e}_n$ $$9.\ \underline{E}_n = \begin{bmatrix} 0 \\ \overline{E}_{n-1} \end{bmatrix} + \underline{\epsilon}_n$$

10. $\underline{\hat{h}}_n = \underline{\hat{h}}_{n-1}$

11. $\overline{\underline{\epsilon}}_{n+1} = \overline{\underline{\epsilon}}_n$

Step 2 still has complexity 10N when FTF is used. Steps 4 has complexity L, steps 3, 7, and 8 each have complexity 2N, and steps 5, and 9 have complexity N. The overall complexity is L+18N. Note that steps 5, 10, and 11 are simply "renaming" operations and step 3 could be eliminated. However, since suspended adaptation is usually only temporary, vector $\tilde{r}_{xx,n}$ must remain current to properly resume operation of, e.g., the first or second illustrative embodiments.

For the echo cancellation application, the first illustrative embodiment may be used when a relaxation parameter other than one (1) is chosen. When adaptation is to be inhibited due to the detection of a near-end signal, the relaxation parameter is merely set to zero during the duration of the near-end signal's presence. While the coefficient adaptation is inhibited, the production of the return signal, $e_n$, continues.

Alternatively, if the relaxation parameter is chosen to be one during adaptation, the second illustrative embodiment may be used. Here, when a near-end signal is detected the echo canceller may switch to the third illustrative embodiment where as before, the coefficient adaptation is inhibited, but $e_n$ continues to be produced. The advantage of using the second and third illustrative embodiments is lower computational complexity.

Figure 9:
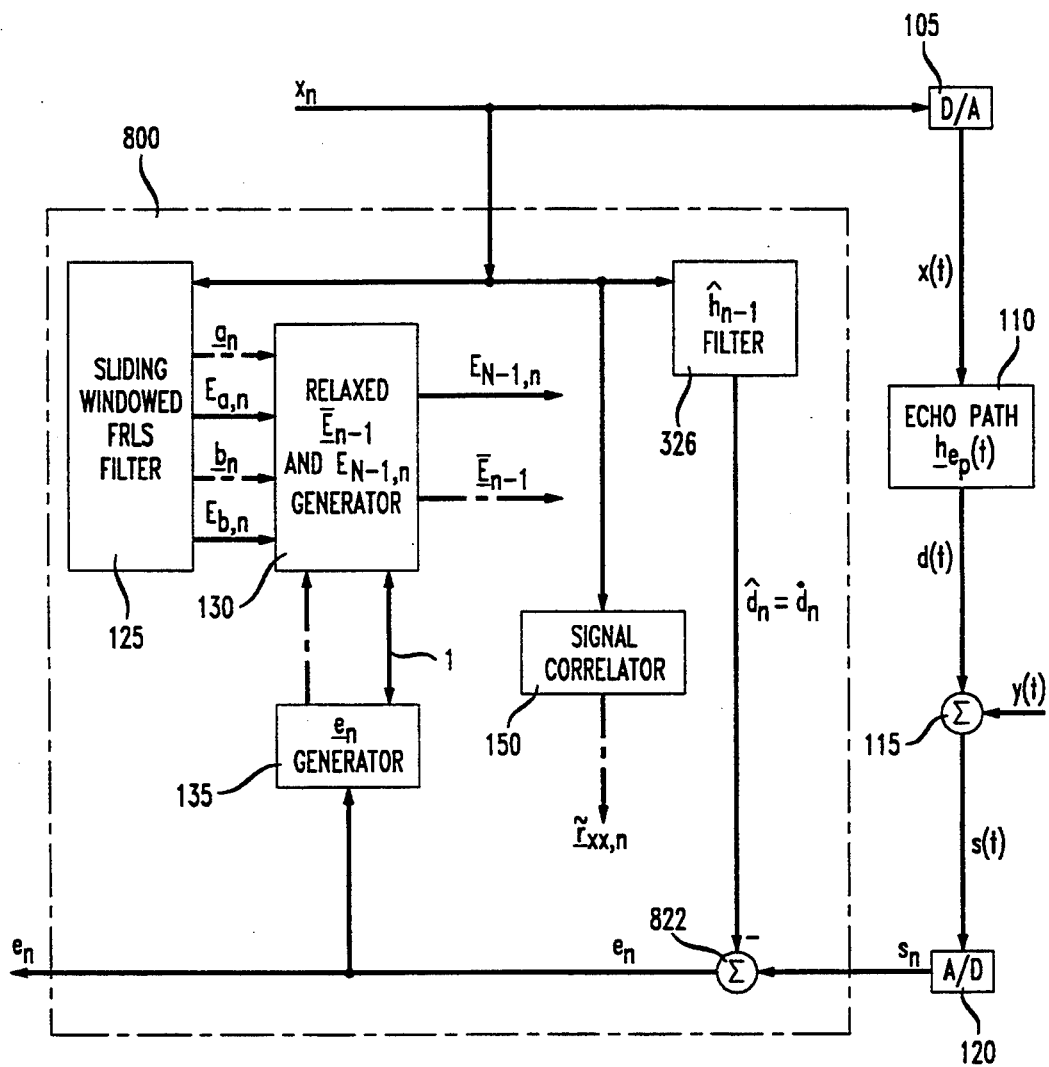
FIG. 9 presents a third illustrative embodiment of the present invention in the context of an acoustic echo canceller application.

FIG. 9 presents the third illustrative embodiment of the invention, namely, FAP adaptive filter with suspended adaptation 800 in the context of an echo canceller application. The inputs, outputs of FAP adaptive filter with suspended adaptation 800 and its arrangement within the echo canceller example are the same as described in FIG. 1. As with the embodiment of FIG. 7, elements of the embodiment of FIG. 9 which are identical to those of FIG. 1 have been labeled with the same reference numerals.

When near-end signal $Y_n$ contains a near-end talker's speech, it is well known to those skilled in the art that in order to prevent divergence of the echo path estimate $\underline{h}_n$ the echo canceller must suspend adaptation of the adaptive filter coefficients. During such periods, returned signal $e_n$ is still produced and sent to the far-end. Conventional devices known as near-end speech detectors, not shown in FIG. 1, provide echo cancellers with information that the near-end talker is active. Thus, adaptive filters must provide the means for the echo canceller to temporarily suspend adaptation of adaptive filter coefficients while simultaneously maintaining production of return signal e n during the presence of near-end speech activity. Also means must be provided for the adaptive filter to resume adaptation of the adaptive filter coefficients at the conclusion of near-end speech activity. For the FAP adaptive filter, this means that while adaptation of provisional echo estimate $\underline{h}_n$ is suspended, production of return signal $e_n$ continues, along with the signals and vectors required to resume adaptation. One method to achieve suspended adaptation is simply to set the relaxation parameter It, to zero in FAP adaptive filter with relaxation 100. FIG. 9 shows a preferred embodiment, however, since it has lower computational complexity.

In FAP adaptive filter with suspended adaptation 800, the far-end or excitation signal, $x_n$ is applied to the well known sliding windowed fast recursive least squares (SW-FRLS) filter 125. SW-FRLS filter 125 produces the forward prediction coefficient vector $\underline{a}_n$, the forward prediction error energy $E_{a,n}$, the backward prediction coefficient vector $\underline{b}_n$, and the backward prediction error energy $E_{b,n}$ in response. These turn are applied to relaxed $\overline{\underline{E}}_{n-1}$ and $E_{N-1,n}$ generator 130. Also applied to relaxed $\overline{\underline{E}}_{n-1}$ and $E_{N-1,n}$ generator 130 is parameter $1-\mu$ (where $\mu$ is set to zero) and the return signal vector $\underline{e}_n$ which is produced by $\underline{e}_n$ generator 135. Relaxed $\overline{\underline{E}}_{n-1}$ and $E_{N-1,n}$ generator 130 produces the scalar output $E_{N-1,n}$ and the vector output $\overline{\underline{E}}_{n-1}$ which must be maintained current while adaptation is suspended. The excitation signal $x_n$ is supplied to $\underline{\hat{h}}_n^{-1}$ filter 326 which produces the provisional echo estimate signal $\hat{d}_n$ which is aliased to signal $d_n$. Signal correlator 150 receives signal $x_n$ as input and produces in response correlation vector $\tilde{r}_{xx,n}$ which must be maintained current while adaptation is suspended. Echo estimate $d_n$ is subtracted from system response signal $s_n$ by summer 822, producing return signal $e_n$. Return signal $e_n$ is returned to the far-end as output and is also supplied to $\underline{e}_n$ generator 135. The scalar quantity $1-\mu$ (where $\mu$ is set to zero) is also supplied to $\underline{e}_n$ generator 135 which produces the return signal vector $\underline{e}_n$ for input into relaxed $\overline{\underline{E}}_{n-1}$ and $E_{N-1,n}$ generator 130.

C. Discussion

In each of the three illustrative embodiments presented above, long delay lines of the excitation signal $x_n$ are shown in multiple places. The person of ordinary skill in the an will recognize that certain efficiencies of implementation may be obtained by use of one or more shared delay lines for $x_n$.

I claim:

1. An adaptive filter for use in echo cancellation, the adaptive filter for generating an echo estimate signal based on an excitation signal, the filter comprising:
   a sliding windowed fast recursive least squares filter for generating forward and backward prediction error energies and forward and backward prediction coefficients based on the excitation signal;
   a signal generator, coupled to the sliding windowed fast recursive least squares filter, for generating a fast affine projection coefficient and a fast affine projection correction vector, based on said forward and backward prediction error energies and said forward and backward prediction coefficients;
   a provisional filter coefficient generator, for recursively generating provisional filter coefficients based on the excitation signal, the fast affine projection coefficient, and previous provisional filter coefficients;
   filter means for generating a provisional echo estimate signal based on the excitation signal and provisional filter coefficients;
   means for generating a provisional echo estimate correction signal based on the excitation signal and the fast affine projection correction vector; and
   means for summing the provisional echo estimate signal and the provisional echo estimate correction signal to produce the echo estimate signal.

2. The adaptive filter of claim 1 wherein the fast affine projection coefficient and the fast affine projection correction vector are generated further based on a regularization parameter signal $\delta > 0$.

3. The adaptive filter of claim 1 wherein the forward and backward prediction error energies have initial conditions which are based on a regularization parameter signal $\delta > 0$.

4. The adaptive filter of claim 1 wherein the signal generator comprises a relaxed fast affine projection coefficient and fast affine projection correction vector signal generator.

5. A method of adaptive filtering for generating an echo estimate signal based on an excitation signal, the method comprising:

generating forward and backward prediction error energies and forward and backward prediction coefficients based on the excitation signal with use of a sliding windowed fast recursive least squares filter;

generating a fast affine projection coefficient and a fast affine projection correction vector based on said forward and backward prediction error energies and said forward and backward prediction coefficients;

recursively generating provisional filter coefficients based on the excitation signal, the fast affine projection coefficient, and previous provisional filter coefficients;

generating a provisional echo estimate signal based on the excitation signal and the provisional filter coefficients;

generating a provisional echo estimate correction signal based on the excitation signal and the fast affine projection correction vector; and summing the provisional echo estimate signal and the provisional echo estimate correction signal to produce the echo estimate signal.

6. The method of claim 5 wherein the fast affine projection coefficient and the fast affine projection correction vector are generated further based on a regularization parameter signal $\delta > 0$.

7. The method of claim 5 wherein the forward and backward prediction error energies have initial conditions which are based on a regularization parameter signal $\delta > 0$.

* * * * *